(12) United States Patent
Mohammadi-Gheidari et al.

(10) Patent No.: US 10,971,326 B2
(45) Date of Patent: Apr. 6, 2021

(54) MULTI-ELECTRON-BEAM IMAGING APPARATUS WITH IMPROVED PERFORMANCE

(71) Applicant: FEI Company, Hillsboro, OR (US)

(72) Inventors: Ali Mohammadi-Gheidari, Eindhoven (NL); Peter Christiaan Tiemeijer, Eindhoven (NL); Erik Rene Kieft, Eindhoven (NL); Gerard Nicolaas Anne van Veen, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/572,114

(22) Filed: Sep. 16, 2019

(65) Prior Publication Data

US 2020/0090899 A1 Mar. 19, 2020

(30) Foreign Application Priority Data

Sep. 14, 2018 (EP) .................................. 18194496

(51) Int. Cl.
*H01J 37/153* (2006.01)
*H01J 37/09* (2006.01)
(Continued)

(52) U.S. Cl.
CPC ............ *H01J 37/153* (2013.01); *H01J 37/09* (2013.01); *H01J 37/10* (2013.01);
(Continued)

(58) Field of Classification Search
CPC ............... H01J 2237/0453; H01J 37/09; H01J 2237/2817; H01J 37/28; H01J 37/153; H01J 37/3177; H01J 2237/0435; H01J 37/04; H01J 37/10; H01J 37/1474; H01J 2237/04735; H01J 2237/0475; H01J 2237/0492; H01J 2237/103;
(Continued)

(56) References Cited

U.S. PATENT DOCUMENTS

| 8,039,813 | B2* | 10/2011 | Casares | ................ | H01J 37/045 |
| | | | | | 250/396 R |
| 9,035,249 | B1* | 5/2015 | Frosien | ................ | H01J 37/05 |
| | | | | | 250/310 |

(Continued)

FOREIGN PATENT DOCUMENTS

| EP | 0794552 | 9/1997 |
| EP | 1577926 | 9/2005 |

(Continued)

*Primary Examiner* — David A Vanore

(57) ABSTRACT

A multi-electron beam imaging apparatus is disclosed herein. An example apparatus at least includes an electron source for producing a precursor electron beam, an aperture plate comprising an array of apertures for producing an array of electron beams from said precursor electron beam, an electron beam column for directing said array of electron beams onto a specimen, where the electron beam column is configured to have a length less than 300 mm, and where the electron beam column comprises a single individual beam crossover plane in which each of said electron beams forms an intermediate image of said electron source, and a single common beam crossover plane in which the electron beams in the array cross each other.

12 Claims, 2 Drawing Sheets

(51) Int. Cl.
*H01J 37/10* (2006.01)
*H01J 37/28* (2006.01)
*H01J 37/147* (2006.01)
*H01J 37/20* (2006.01)

(52) U.S. Cl.
CPC .......... *H01J 37/1472* (2013.01); *H01J 37/20* (2013.01); *H01J 37/28* (2013.01); *H01J 2237/0453* (2013.01); *H01J 2237/04735* (2013.01); *H01J 2237/20228* (2013.01)

(58) Field of Classification Search
CPC ....... H01J 2237/1534; H01J 2237/1536; H01J 2237/2448; H01J 2237/31774; H01J 37/145; H01J 37/1472; H01J 37/226; H01J 37/244; H01J 37/3174; H01J 2237/047; H01J 2237/04756; H01J 2237/04922; H01J 2237/04924; H01J 2237/04926; H01J 2237/06; H01J 2237/0635; H01J 2237/1205; H01J 2237/14; H01J 2237/15; H01J 2237/153; H01J 2237/20228; H01J 2237/21; H01J 2237/2446; H01J 2237/24592; H01J 2237/25; H01J 2237/2561; H01J 2237/28; H01J 2237/2806; H01J 37/045; H01J 37/05; H01J 37/06; H01J 37/14; H01J 37/147; H01J 37/20; H01J 37/2007; B82Y 10/00; B82Y 40/00
USPC .......... 250/396 R, 398, 492.2, 306, 307, 310, 250/311, 396 ML, 400, 492.1
See application file for complete search history.

(56) References Cited

U.S. PATENT DOCUMENTS

| | | | |
|---|---|---|---|
| 9,224,576 B2* | 12/2015 | Knippelmeyer | H01J 37/09 |
| 9,922,796 B1* | 3/2018 | Frosien | H01J 37/28 |
| 2003/0085360 A1* | 5/2003 | Parker | H01J 37/3174 |
| | | | 250/396 R |
| 2003/0209676 A1* | 11/2003 | Loschner | B82Y 10/00 |
| | | | 250/492.2 |
| 2012/0241606 A1 | 9/2012 | Han et al. | |
| 2018/0158642 A1* | 6/2018 | Frosien | H01J 37/226 |
| 2020/0090899 A1* | 3/2020 | Mohammadi-Gheidari | |
| | | | H01J 37/10 |

FOREIGN PATENT DOCUMENTS

| | | |
|---|---|---|
| EP | 2816585 | 12/2014 |
| EP | 2879155 | 6/2015 |
| WO | 2018099854 | 6/2018 |

* cited by examiner

MULTI-ELECTRON-BEAM IMAGING APPARATUS WITH IMPROVED PERFORMANCE

FIELD OF THE INVENTION

The invention relates generally to electron beam imaging and specifically to multi-electron beam imaging systems.

BACKGROUND OF THE INVENTION

Electron microscopy has traditionally used a single electron beam to probe samples. The single electron beam can be scanned across a desired area of the sample to obtain images and other data. While this technique is good in many aspects, the throughput may be slow and/or limited. To increase throughput, multi-electron beam imaging has been attempted in various arrangements. While the sample may be interrogated by multiple electron beams at once and throughput is improved, the image quality is not to a desired quality in most instances. While attempts to address this downside have been attempted, no solution to date provides the desirable image quality. As such, a multi-electron beam system with improved image quality is desired.

BRIEF DESCRIPTION OF THE DRAWINGS

Like reference numerals refer to corresponding parts throughout the several views of the drawings.

DETAILED DESCRIPTION OF EMBODIMENTS

Figure 1:
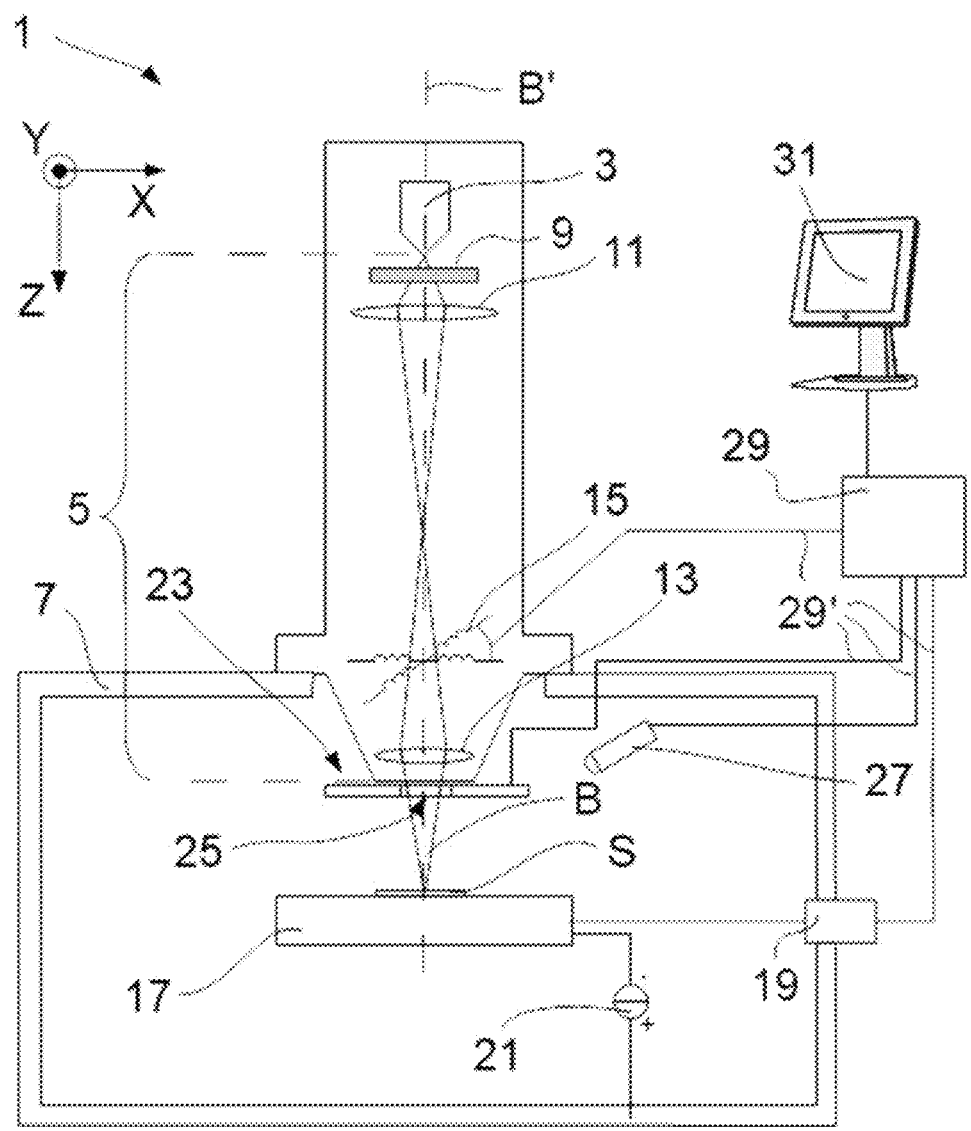
FIG. 1 renders a longitudinal cross-sectional elevation view of an embodiment of a charged particle imaging apparatus—in this case, an electron microscope—in accordance with an embodiment of the present disclosure.

Embodiments of the present invention are described below in the context of a multi-electron beam system having a reduced column length. The reduced column length, for example, reduces Coulomb interactions and allows for improved imaging at higher electron beam currents. However, it should be understood that the methods described herein are generally applicable to a wide range of different tomographic methods and apparatus, including both cone-beam and parallel beam systems, and are not limited to any particular apparatus type, beam type, object type, length scale, or scanning trajectory As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

The disclosure relates to an electron beam imaging apparatus comprising: a specimen holder, for holding a specimen, an electron source for producing a precursor electron beam, an aperture plate comprising an array of apertures for producing an array of electron beams from said precursor electron beam, and an electron beam column, for directing said array of electron beams onto said specimen.

Examples of electron beam imaging apparatus include Electron Microscopes (EMs) and electron beam lithography imaging systems (used inter alia to write integrated circuit patterns onto photoresist-coated semiconductor substrates). Electron microscopy is a well-known and increasingly important technique for imaging microscopic objects. Historically, the basic genus of Electron Microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" apparatus (e.g. a FIB-SEM), which additionally employ a "machining" Focused Ion Beam (FIB), allowing supportive activities such as ion-beam milling or Ion-Beam-Induced Deposition (IBID), for example. More specifically:

In a SEM, irradiation of a specimen by a scanning electron beam precipitates emanation of "auxiliary" radiation from the specimen, in the form of secondary electrons, backscattered electrons, X-rays and cathodoluminescence (infrared, visible and/or ultraviolet photons), for example; one or more components of this emanating radiation is/are then detected and used for image accumulation purposes.

In a TEM, the electron beam used to irradiate the specimen is chosen to be of a high-enough energy to penetrate the specimen (which, to this end, will generally be thinner than in the case of a SEM specimen); the transmitted electrons emanating from the specimen can then be used to create an image. When such a TEM is operated in scanning mode (thus becoming a STEM), the image in question will be accumulated during a scanning motion of the irradiating electron beam.

An SEM can also be used in "transmission mode", e.g. when using relatively thin specimens and a relatively high incident beam energy. Such a tool is often called a "TSEM" (Transmission SEM), and it will typically have a relatively rudimentary imaging system (e.g. a single lens and deflector) disposed between the specimen and post-specimen detector.

It should be noted that, in addition to imaging, performing (localized) surface modification (e.g. milling, etching, deposition, etc.), and conducting spectroscopy, an electron microscope may also have other functionalities, such as examining diffractograms, studying ion channeling/ion backscattering (Rutherford Backscattering Spectrometry), etc. Note that, in electron microscopy, the beam impinging upon the specimen is often referred to as a "probe".

In a lithography imaging system (e.g. wafer stepper/wafer scanner), an actinic beam of radiation is used to pattern an energy-sensitive layer of material (photoresist) that has been provided (e.g. spin-coated) on a surface of a substrate (e.g. semiconductor wafer). Traditionally, the actinic beam has comprised a broad beam of photons (e.g. from a mercury lamp or laser), which pass through a mask/reticle and its pattern onto the energy-sensitive later. However, other types of lithography imaging system make use of charged particles, such as so-called "direct write" electron beam tools, which trace one or more electron beams over the energy-sensitive layer according to the desired pattern.

In all cases, an electron beam imaging apparatus will comprise at least the following components:

An electron source, comprising a Field Emission Gun (FEG; Schottky or Cold FEG) or LaB6 thermal source, for example.

An illuminator (electron beam column; electron-optical column), which serves to manipulate a "raw" radiation beam from the source and perform upon it certain operations such as focusing, aberration mitigation, cropping (with a diaphragm), filtering, etc. It will generally comprise one or more (charged-particle) lenses, and may comprise other types of (particle-)optical component also. If desired, the illuminator can be provided with a deflector system that can be invoked to cause its exit beam to perform a scanning motion across the specimen being investigated.

A specimen holder, on which a specimen under investigation can be held and positioned (e.g. tilted, rotated). If desired, this holder can be moved so as to effect scanning motion of the specimen w.r.t. the beam. In general, such a specimen holder will be connected to a positioning system. When designed to hold cryogenic specimens, the specimen holder can comprise means for maintaining said specimen at cryogenic temperatures, e.g. using an appropriately connected cryogen vat.

A transmission-type apparatus, such as a (S)TEM or TSEM, for instance, will additionally comprise:

An imaging system, which essentially takes electrons that are transmitted through a specimen (plane) [or mask plane, in lithography] and directs (focuses) them onto a target such as a detection/imaging device, spectroscopic apparatus, resist-coated substrate [in lithography], etc. As with the illuminator referred to above, the imaging system may also perform other functions, such as aberration mitigation, cropping, filtering, etc., and it will generally comprise one or more charged-particle lenses and/or other types of electron-optical components.

Conventional electron beam imaging apparatus have made use of unitary imaging beams. However, in recent years, multi-beam apparatus designs have begun to emerge, in which a precursor beam from an electron source is converted into an array of sub-beams by positioning a multi-aperture plate within a footprint of said precursor beam; such an aperture plate can also be referred to as an Aperture Lens Array (ALA), since the apertures therein have a lensing effect (when used in combination with a complementary electrode).

The basic idea behind the simultaneous use of several primary beams—as opposed to just a single beam—is that it promises significant throughput improvement, since the use of an array of beams allows "parallel imaging." However, the concurrent use of multiple imaging beams (which may also be referred to as beamlets, sub-beams, component beams, etc.) also presents various technical problems and challenges, which need to be addressed. One area in which such problems arise is imaging/patterning quality, particularly when a relatively high image brightness is desired.

It is an object of the present disclosure to provide an improved multi-electron-beam imaging apparatus. More specifically, it is an object of the present disclosure that such an imaging apparatus should enable more satisfactory imaging performance than existing multi-electron-beam designs, particularly at relatively high beam currents.

These and other objects are achieved in an imaging apparatus as set forth in the opening paragraph above, when the electron beam column is configured to have a length L less than 300 mm. The column length L is here defined as the distance between the electron source and the specimen.

A fundamental problem with electron-beam imaging apparatuses (as opposed to photon imaging, for example) is that the beam electrons can influence one another via Coulomb interactions. Such interactions can slightly change the trajectory of an electron, causing its position relative to the optical axis to deviate from an original/nominal value. The cumulative effect of many such interactions is a (statistical) "beam spreading" phenomenon, whereby, for example, a nominal round footprint of the beam on a given plane (e.g., specimen plane or detector plane) becomes swollen, and acquires a perimetric "halo" of deviated electrons. This causes image blur, but also reduces image intensity (since an equal number of electrons is now spread over a greater footprint). For a given required resolution, this Coulomb beam spreading sets a fundamental limit on the maximum beam current that can be allowed in the beam, and accordingly sets a fundamental limit upon the throughput that can be achieved in a single-beam imaging apparatus.

Multi-beam electron imaging apparatus are intended to boost throughput. A common assumption underlying the use of multi-beam apparatus is that an electron in a given sub-beam will only (or mainly) experience Coulomb interactions with other electrons in its own sub-beam, and will not (or hardly) experience Coulomb interactions with electrons in other sub-beams, provided these sub-beams do not cross each other. On the basis of this assumption, one can expect to increase the total current in the column essentially arbitrarily by appropriately increasing the number of sub-beams, provided these sub-beams have no (or almost no) crossovers (i.e., locations where beams cross each other).

The inventors investigated such Coulomb interactions extensively. On the assumption that beam crossovers in the design of the electron beam column were "breeding grounds" for such Coulomb interactions, they set about testing column designs in which such crossovers were reduced in number, or largely eliminated; surprisingly, the inventors found that, although the magnitude of the above-mentioned blur/beam spreading problem was diminished in such designs, it was still present to a significant extent. Further extensive analysis unexpectedly revealed that the interactions between electrons in different sub-beams are larger than previously assumed. This can be clarified using the following (non-relativistic) example. Consider a sub-beam carrying I=1 nA of beam current at V=10 kV beam potential. The average longitudinal (Z) distance between the electrons in this sub-beam is $d_z=ev_z/I=10$ mm, using $v_z=\sqrt{(2 eV/m)}=6\times10^7$ m/s (where e is the elementary electronic charge, $v_z$ is electron velocity, and m is electron mass). This is much more than the typical lateral separation between sub-beams, which is indicatively in a range of ca. 10-500 μm. Accordingly, it is much more likely that the nearest neighbor of a given electron will be in a different sub-beam as opposite to the same sub-beam. Hence, it transpires that Coulomb interactions occur between all electrons in all sub-beams, with only a relatively minor dependence upon whether the individual sub-beams cross each other or whether they travel separately down the column.

Importantly for the present disclosure, the inventors found that a critical factor influencing the attainable image resolution was the length L of the electron beam column; in fact, the inventors found that:

The effect of electron-electron interactions scaled—to a good approximation—according to $\sim L^2$. This can be roughly explained on the basis that: a longer column gives a linearly longer time for interactions to occur, and; a longer column gives a linearly longer "arm" to leverage the effect of such interactions. These two linear effects combine to produce said quadratic dependence on L.

A shorter value of L results in a lower magnification value, which allows the aperture plate/ALA to have larger apertures at a smaller pitch—resulting in greater transmission; such an aperture plate/ALA is relatively easy to manufacture compared to one with smaller apertures. Associatively, a shorter value of L results in a smaller beam opening angle at the aperture plate/ALA; in a column design without an extra (intervening) beam-defining aperture, this will concurrently result in a smaller beam opening angle at specimen level, which, in turn, will generally lead to a reduction in aberrations. To give an alternative elucidation: the (spatial) magnification from source to specimen scales approximately with L. The angular magnification from source to specimen scales inversely with the (spatial) magnification; accordingly, for a fixed opening angle at the source, a larger L gives a larger opening angle in the "probe" impinging on the specimen, and correspondingly larger aberrations in the probe-forming optics.

These aberrations could be reduced by limiting the beam diameter (e.g., by using smaller apertures in the aperture plate/ALA), but this would associatively reduce the probe current, which is undesirable, and also reduce manufacturability of the aperture plate/ALA.

Steps were therefore taken to develop a shortened column, and, for values of L below about 300 mm, the aforementioned problems of blur/beam spreading were brought within acceptable tolerances. This solution is inter alia advantageous in that it does not per se demand a reduction in beam current (which would commensurately reduce throughput) in order to get the Coulomb interaction problem under control.

It should be noted that shrinking the column length L in this manner is somewhat counter-intuitive. This is because a typical column will contain a multiplicity of relatively bulky particle-optical components that need to be positioned and aligned within strict tolerances, and this has traditionally resulted in relatively long/spacious column designs. Abandoning such spacious designs in favor of a much tighter/more compact configuration would therefore generally be seen as undesirable. For reference, it should be noted that other multi-beam SEM described in the literature have a column length of ca. 500 mm—which is 66% greater than the upper limit posed by the present disclosure.

In an embodiment of the disclosure, the column length L is less than 200 mm. The inventors have found that the "Coulomb blur" $B_c$ (inverse resolution) at specimen level scales according to the formula:

$$B_c \sim IL^2/V^{4/3}$$

in which I is the (cumulative) beam current, V is the beam potential (accelerating voltage), and L is the column length. Reducing L thus allows I to be increased (for a comparable resolution) or allows a further resolution enhancement (for a given value of I). Although L values in the range 200-300 mm typically gave good results, L values below 200 mm were found to be more satisfactory.

As defined herein, the electron beam column is configured to have a length L less than 300 mm, by comprising: a single individual beam crossover plane, in which each of said electron beams forms an intermediate image of said electron source; and a single common beam crossover plane, in which the electron beams in the array cross each other (or, put another way: cross the optical axis of the electron beam column).

Traditional electron beam columns—in both single-beam apparatus and, for example, in multi-beam SEM—tend to have several beam crossovers in their designs. In addition to an objective lens, such configurations may, for example, wish to make use of various other optical elements upstream of the objective, such as a condenser lens, a variable field stop in the heart of the column (with which the beam current—and, thus, image brightness—can be conveniently adjusted), an additional magnifying lens, etc. The incorporation of such optical elements inevitably leads to the presence of associated beam crossovers (individual and/or common). Since, as already set forth above, such crossovers tend to exacerbate Coulomb interactions, the inventors have developed a "spartan" column design that limits the number/type of crossovers to a practical minimum. Moreover, this spartan design also makes it easier to achieve a relatively short column. It is noted that the single individual beam crossover plane and the single common beam crossover plane are parallel planes, meaning that these planes do not coincide. In other words, the single common beam crossover plane is parallel to the single individual beam crossover plane.

In an embodiment, the individual electron beams are out of focus whilst they cross each other in the single common beam crossover plane. This reduces the Coulomb interactions between the electrons in the various sub-beams.

In a particular embodiment of the invention, the electron beam column comprises: a corrector lens, disposed downstream of the aperture plate; and an objective lens, between said corrector lens and the specimen.

A (composite/compound) corrector lens as here specified can, for example, comprise: an accelerating stage and a collimator lens. The accelerating stage is for accelerating electrons from the relatively low potential at which the aperture plate/ALA operates (typically ca. 1-2 kV) to the relatively high potential at which the main column operates (typically ca. 10-20 kV). A relatively low potential for the aperture plate/ALA is favorable because it facilitates its construction; on the other hand, a relatively high potential for the main/lower column is favorable because of the reduced impact of Coulomb interactions at higher potential, and because the resolution of the "probe" improves thanks to the shorter wavelength of electrons and the reduced chromatic blur at higher potential. The accelerator stage can, for example, comprise a series "train" of pairs of accelerator electrodes, which provide a cascade electrostatic field configuration in which electrons are accelerated in steps.

The collimator lens is for collimating/focusing the sub-beams. This collimator lens is ideally positioned such that the plane of the (intermediate) images of the source is in/near the center of this lens, so as to avoid defocusing/blurring these intermediate images (e.g., via off-axial chromatic aberration). Furthermore, this lens will generally be positioned relatively close (e.g., within ca. 30 mm) to the aperture array/ALA, to prevent the diverging array of sub-beams that exits the aperture array/ALA from becoming large enough in the collimator lens for spherical aberration effects to significantly distort the pattern of the sub-beams.

It is noted that the previous multi-beam SEMs have a specific corrector lens comprising four electrodes, which are configured such that:

The first three electrodes mainly collimate (but also accelerate); and

The fourth electrode mainly accelerates (but also collimates).

The specified objective lens serves to image and de-magnify (upon the specimen) the plane with the array of (intermediate) images of the source. In order to minimize aberrations, the abovementioned collimator lens is ideally tuned such that all sub-beams pass through the so-called "coma-free" point of the objective lens. The coma-free point of a lens is usually close to the heart of the lens; as is known to the skilled artisan, the lens will not afflict a tilted beam (such as said sub-beams) with coma aberration when the tilted beam passes through this come-free point.

With reference to the discussion in the previous paragraph, one can, for example, use a column design in which:

Said individual beam crossover plane is located in/proximal to said corrector lens; and Said common beam crossover plane is located in/proximal to said objective lens.

Figure 3:
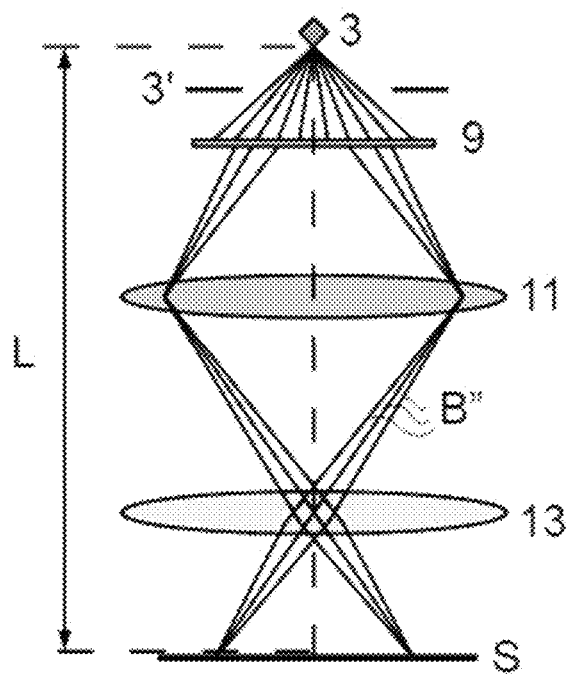
FIG. 3 illustrates a particular electron beam column according to an embodiment of the present invention in accordance with an embodiment of the present disclosure.

See FIG. 3, for example.

The disclosed technique lends itself to use in a scanning-type imaging apparatus, in which an image is accumulated during relative (lateral) scanning motion of the beam array and the specimen, effected using a scanning assembly. Such relative scanning motion can be achieved in different ways. For example:

(i) In one possible ("mechanical scan") set-up, the employed scanning assembly comprises an actuator system for producing scanning motion of the specimen holder.

(ii) In an alternative ("beam scan") set-up, the employed scanning assembly comprises a beam deflector system for deflecting the beam array relative to the specimen. For example, in a multi-beam STEM:

A first beam deflector system, upstream of the specimen, can be invoked to produce scanning motion of the beam array relative to the specimen; and A second beam deflector system, downstream of the specimen and upstream of an imaging detector, can be used to nullify the scanning motion produced by said first beam deflector system (so-called "de-scan").

Approach (i) is advantageous in that it tends to be less complex/composite than approach (ii)—though it will require use of a specimen holder stage that is capable of accurately traversing a scan path; this does not have to present a technical hurdle, since sophisticated scanning stages are already used in lithography, for example, and are available in many different implementations. Beam scanning is the more traditional approach used in single-beam EMs (such as SEMs and STEMs), though the current invention will require its modification to plural beams. Needless to say, if desired, one can also choose a hybrid of approaches (i) and (ii), in which both types of scanning are employed.

As regards the cardinality of (number of component beams in) the beam array used in the invention, it should be emphasized that this is discretionary. On the one hand, the greater the number of beams, the greater the throughput enhancement that can be achieved. On the other hand, a greater number of beams will increase overall system complexity; moreover, as explained above, since electrons in different beams do interact with one another, a greater number of beams will also tend to increase Coulomb blur. The skilled artisan will be able to find a compromise between these competing effects, and choose a number that is appropriate to a given scenario/use case. For example, one could construct a system using 196 beams in a 14×14 array—though many other beam pluralities/configurations are possible.

FIG. 1 (not to scale) is a highly schematic depiction of an embodiment of an electron beam imaging apparatus in which the present invention is exploited; more specifically, it shows an embodiment of a SEM—though, in the context of the current invention, it could also be a STEM or a lithographic imaging system, for example. The imaging apparatus (microscope) 1 comprises (inter alia):

An electron source 3 (such as a Schottky emitter, cold FEG or LaB6 filament, for example) that produces an electron beam B that propagates along a particle-optical axis B'.

An electron beam column 5, comprising various lenses 11, 13 to direct/focus the electron beam B, and a deflection unit 15 to perform beam deflection/scanning of the beam B. Column 5 may also comprise aberration correctors, field stops, etc.

A vacuum chamber 7, comprising a specimen holder 17 and associated stage/actuator 19 for holding/positioning a specimen S. The vacuum chamber 7 (and also column 5/source 3) is evacuated using vacuum pumps (not depicted). With the aid of voltage source 21, the specimen holder 17, or at least the specimen S, may, if desired, be biased (floated) to an electrical potential with respect to ground.

By scanning the electron beam B over the specimen S, output radiation—comprising, for example, X-rays, infrared/visible/ultraviolet light, secondary electrons and/or backscattered electrons—emanates from the specimen S. Detectors 23, 27 can be chosen from a variety of possible detector types that can be used to examine different types/modalities of such output radiation. In the apparatus depicted here, the following detector choices have been made:

Detector 23 is a segmented electron detector, comprising a plurality of independent detection segments (e.g. quadrants) disposed about a central opening 25 (encompassing the optical axis B'). Such a detector can, for example, be used to investigate the angular dependence of (secondary/backscattered) electrons emerging from the specimen S.

Detector 27 is, for example, an X-ray detector, which can be used to register X-rays emanating from the specimen S, and thus perform Energy-Dispersive X-ray Spectroscopy (EDX). It could alternatively be a cathodoluminescence detector, for example.

Alternatively/supplementally, use could be made of a backscattered electron detector, for example. Since the detected output radiation is position-dependent (due to said scanning motion), the information obtained from the detectors 23, 27 will also be position-dependent, and can thus be used to assemble an image that is basically a map of detector output as a function of scan-path position on the specimen S. The signals from the detectors 23, 27 pass along control lines (buses) 29', are processed by the controller 29, and displayed on display unit 31. Such processing may include operations such as combining, integrating, subtracting, false coloring, edge enhancing, and other processing known to the skilled artisan. In addition, automated recognition processes (e.g. as used for particle analysis) may be included in such processing.

Various refinements and alternatives of such a "basic" set-up will be known to the skilled artisan, including, but not limited to:

The use of dual primary beam species—for example an electron beam for imaging and an ion beam for machining (or, in some cases, imaging) the specimen S;

The use of a controlled environment at the specimen S—for example, maintaining a pressure of several mbar (as used in a so-called Environmental SEM) or by admitting gases, such as etching or precursor gases.

Figure 2:
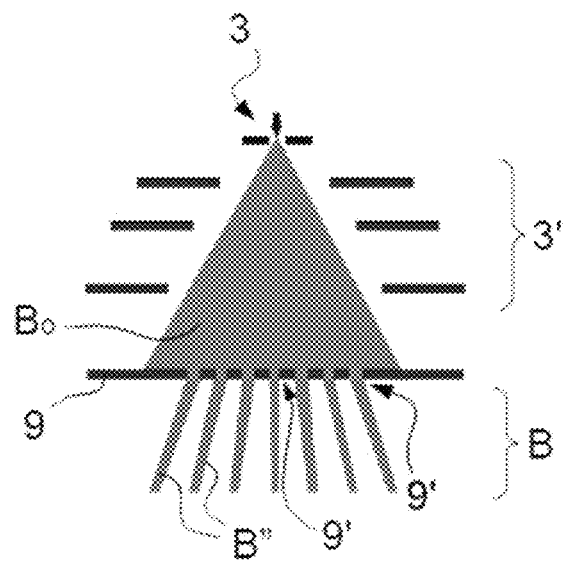
FIG. 2 illustrates a manner in which an electron beam array is generated from a single precursor beam in accordance with an embodiment of the present disclosure.

Of importance to the present disclosure is the fact that a single primary electron beam—as used in a conventional SEM—is here replaced by a multi-beam array. FIG. 2 shows how such a multi-beam array can be generated, using a relatively small modification to FIG. 1. A precursor (syn. progenitor; initial) electron beam $B_o$ leaves the electron source 3, traverses a series of electrodes 3', and impinges upon an aperture plate/ALA 9, which contains a plurality of apertures 9'; such a structure 9 can, for example, be manufactured by using thin film (MEMS) technology to etch an array of small apertures in a silicon sheet. The aperture plate/ALA 9 is located within electron beam column 5, and will typically be disposed relatively close to the electron source 3, e.g., at a separation of the order of about 5-10 mm downstream thereof. As a result of impinging on the ALA 9, the precursor beam $B_o$ is converted into a plurality/array B of sub-beams/beamlets/component beams B", in the same geometric configuration as the plurality of apertures 9" used to generate them. This beam array B then follows its course along axis B' through the column 5, which directs it onto the specimen S (see FIG. 1). In somewhat more detail:

The aperture plate/ALA comprises an array of 14×14 apertures 9', each with a diameter of ca. 10 µm and at a pitch/separation of ca. 20 µm.

The electrodes 3' create potential variations at each aperture 9', such that each aperture 9' acts as an electrostatic mini-lens. In this way, the various sub-beams B" are focused to an array of (intermediate) images of the source 3 downstream of the aperture plate/ALA 9.

In principle, only one electrode 3' is needed to work in concert with the aperture plate/ALA 9 to produce this lensing effect; however, use of more than one electrode 3' gives more possibilities as regards "fine tuning".

The distance between the source 3 and the various apertures 9' (electrostatic mini-lenses) of the aperture plate/ALA 9 increases slightly with increasing distance from the optical/column axis B'. If all apertures/mini-lenses 9' had the same focal strength, this would cause variation in the image distances of the (intermediate) images of the source 3, such that these images would not lie in one common plane perpendicular to the optical/column axis B', but would instead lie on a curved surface (essentially part of a sphere). In order to prevent such curving of this plane with the (intermediate) source images, use can be made of a correctional electrode that is dimensioned such that its field predominantly affects the focal strengths of the outer mini-lenses. By appropriately tuning the electrical potential on this correctional electrode, the aforementioned curving can be mitigated/eliminated. Such a correctional electrode can be comprised in the illustrated group of electrodes 3', e.g. as set forth in the journal article by Y. Zhang and P. Kruit, "Design of a high brightness multi-electron-beam source", Proc. Seventh Int. Conf. on Charged Particle Optics, Physics Procedia 1 (2008), pp. 553-563, Elsevier pub. Alternatively, a correctional electrode of this type can be located downstream of the ALA 9, e.g. as set forth in U.S. Pat. No. 8,598,545 (incorporated herein by reference).

In the specific context of the present invention, the length L of the column 5—between the electron emitting structure (tip) of source 3 and the (top) surface of specimen S—is reduced relative to prior-art multi-beam imaging systems, and has a value L<300 mm, preferably L<200 mm.

FIG. 3 illustrates a particular electron beam column according to an embodiment of the present invention. Here:

Lens 11 is a (composite) corrector lens as set forth above. Note the individual beam crossovers (intermediate source images) in the (plane of the) lens.

Lens 13 is an objective lens as set forth above. Note the common beam crossovers in the (plane of the) lens. Here, the individual beams are out of focus whilst crossing each other.

Individual beam crossovers (intermediate source images) are also present on the surface of the specimen S, but there are no other crossovers present (particularly between lenses 11 and 13). So as not to unnecessarily clutter the Figure, the scan coils 15 have been omitted from this illustration.

The embodiments discussed herein to illustrate the disclosed techniques should not be considered limiting and only provide examples of implementation. For example, electron beam columns between 100 mm to 400 mm are possible and the same high beam current improved imaging may be realized. Additionally, additional column elements, such as beam blankers and Faraday cups may be included and are within the scope of the present disclosure. Those skilled in the art will understand the other myriad ways of how the disclosed techniques may be implemented, which are contemplated herein and are within the bounds of the disclosure.

What is claimed is:

1. An electron beam imaging apparatus comprising:
   an electron source, for producing a precursor electron beam;
   an aperture plate comprising an array of apertures, the aperture plate for producing an array of electron beams from said precursor electron beam;
   an electron beam column for directing said array of electron beams onto a specimen,
   wherein said electron beam column is configured to have a length less than 300 mm, said electron beam column including:
      a single individual beam crossover plane in which each of said electron beams forms an intermediate image of said electron source; and
      a single common beam crossover plane in which the electron beams in the array cross each other.

2. The apparatus of to claim 1, wherein the length is less than 200 mm.

3. The apparatus of claim 1, wherein the electron beam column further comprises:
   a corrector lens disposed downstream of the aperture plate; and an objective lens disposed between said corrector lens and the specimen.

4. The apparatus of to claim 3, wherein:
said individual beam crossover plane substantially lies within the corrector lens; and
said common beam crossover plane substantially lies within the objective lens.

5. The apparatus of claim 3, wherein the corrector lens includes an accelerator stage and a collimator lens.

6. The apparatus of claim 5, wherein the accelerator stage includes a series of accelerator electrodes to provide a cascade electrostatic field environment.

7. The apparatus of claim 3, wherein a spatial arrangement of the corrector lens and the objective lens causes individual ones of the array of electron beams to be out of focus in the single common beam crossover plane.

8. The apparatus of claim 1, further comprising a collimator lens arranged at the individual beam crossover plane, the collimator lens configured to collimate each of electron beam of the array of electron beams.

9. The apparatus of claim 8, wherein the collimator lens is disposed within 30 mm of the aperture plate.

10. The apparatus of claim 1, further comprising a specimen holder for holding the specimen.

11. The apparatus of claim 10, wherein the specimen holder is configured to provide scanning motion to the sample.

12. The apparatus of claim 1, further comprising a beam deflector system for deflecting the array of electron beams relative to the specimen.

* * * * *